United States Patent
Cherubini et al.

(10) Patent No.: US 10,177,876 B2
(45) Date of Patent: *Jan. 8, 2019

(54) SEQUENCE DETECTOR

(71) Applicant: INTERNATIONAL BUSINESS MACHINES CORPORATION, Armonk, NY (US)

(72) Inventors: Giovanni Cherubini, Rueschlikon (CH); Roy D. Cideciyan, Rueschlikon (CH); Thomas H. Toifl, Zurich (CH); Hazar Yuksel, Kilchberg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/915,238

(22) Filed: Mar. 8, 2018

(65) Prior Publication Data
US 2018/0198558 A1 Jul. 12, 2018

Related U.S. Application Data

(62) Division of application No. 15/251,673, filed on Aug. 30, 2016, now Pat. No. 9,942,005.

(51) Int. Cl.
| H04L 1/00 | (2006.01) |
| H03M 13/39 | (2006.01) |
| H03M 13/41 | (2006.01) |
| H04L 25/03 | (2006.01) |

(52) U.S. Cl.
CPC ...... H04L 1/0054 (2013.01); H03M 13/3977 (2013.01); H03M 13/4115 (2013.01);
(Continued)

(58) Field of Classification Search
CPC ............. H03M 13/39; H03M 13/3905; H03M 13/3977; H03M 13/41; H03M 13/4114;
(Continued)

(56) References Cited

U.S. PATENT DOCUMENTS 5,331,665 A * 7/1994 Busschaert .......... H03M 13/41
375/341
5,508,752 A * 4/1996 Kim ..................... H04L 1/0054
348/470
7,277,506 B1 * 10/2007 Pope ................. H04L 25/03197
375/341
(Continued)

OTHER PUBLICATIONS

List of IBM Patents or Patent Applications Treated as Related; Date Filed: Mar. 8, 2018, 2 pages.

*Primary Examiner* — Young T Tse
(74) *Attorney, Agent, or Firm* — Cantor Colburn LLP; Daniel Morris

(57) ABSTRACT

A sequence detector is provided for detecting symbol values corresponding to a sequence of input samples obtained from a transmission channel. The sequence detector comprises a branch metric unit (BMU), a path metric unit (PMU) and a survivor memory unit. The branch metric unit calculates branch metrics for respective possible transitions between states of a trellis. The path metric unit accumulates branch metrics provided by the branch metric unit in order to establish path metrics. The survivor memory unit selects a survivor path based on the path metrics and outputs a survivor sequence of the detected symbols corresponding to the survivor path. The sequence detector is configured such that the synchronization length is different than the survivor path memory length.

7 Claims, 18 Drawing Sheets

(52) U.S. Cl.
CPC ........ *H03M 13/4169* (2013.01); *H04L 1/006* (2013.01); *H04L 1/0052* (2013.01); *H04L 25/03* (2013.01)

(58) Field of Classification Search
CPC ........... H03M 13/413; H03M 13/4169; H03M 13/4192; H04L 1/0036; H04L 1/0045; H04L 1/0046; H04L 1/0047; H04L 1/005; H04L 1/0051; H04L 1/0054; H04L 1/006; H04L 1/0064; H04L 1/0066; H04L 1/0052; H04L 25/03
USPC ............... 375/224, 226, 262, 265, 340, 341; 714/791, 792, 794–796
See application file for complete search history.

(56) References Cited

U.S. PATENT DOCUMENTS

| | | | | |
|---|---|---|---|---|
| 2001/0025358 A1* | 9/2001 | Eidson | ................. | H03M 13/09 714/752 |
| 2003/0007578 A1* | 1/2003 | Kuo | ................. | G11B 20/10009 375/341 |
| 2004/0158542 A1* | 8/2004 | Bruls | ................. | H03M 13/395 714/795 |
| 2005/0141629 A1* | 6/2005 | Markman | ........... | H03M 13/256 375/265 |
| 2005/0278605 A1* | 12/2005 | Xu | ........................ | H03M 13/23 714/758 |
| 2007/0124652 A1* | 5/2007 | Litsyn | ................. | G06F 11/1068 714/776 |
| 2007/0277081 A1* | 11/2007 | Liao | ...................... | H03M 13/23 714/795 |
| 2009/0187813 A1* | 7/2009 | Haratsch | ........... | H03M 13/4107 714/795 |
| 2011/0307767 A1* | 12/2011 | Kelin | .................... | H03M 13/41 714/795 |
| 2014/0177767 A1* | 6/2014 | Azadet | ................ | H03M 13/256 375/348 |
| 2018/0062671 A1 | 3/2018 | Cherubini | | |
| 2018/0062790 A1 | 3/2018 | Cherubini | | |

\* cited by examiner

| Transmission system | SER | $\alpha$ | $\beta$ | $\rho$ | $L\,(R/r)$ |
|---|---|---|---|---|---|
| Uncoded 4-PAM | $10^{-5}$ | 5 | 0 | 48 | 53 |
| Uncoded 4-PAM | $10^{-7}$ | 6 | 0 | 48 | 54 |
| 4-D 5-PAM TCM | $10^{-5}$ | 8 | 0 | 48 | 56 |
| 4-D 5-PAM TCM | $10^{-7}$ | 24 | 8 | 48 | 80 |

Performance comparison for $h_1=0.6$

FIG. 17

| Transmission system | SER | $\alpha$ | $\beta$ | $\rho$ | $L\ (R/r)$ |
|---|---|---|---|---|---|
| Uncoded 4-PAM | $10^{-5}$ | 28 | 8 | 48 | 84 |
| Uncoded 4-PAM | $10^{-7}$ | 40 | 16 | 48 | 104 |
| 4-D 5-PAM TCM | $10^{-5}$ | $>\rho$ | $>\rho$ | 48 | N/A |
| 4-D 5-PAM TCM | $10^{-7}$ | $>\rho$ | $>\rho$ | 48 | N/A |

Performance comparison for $h_1=1$

FIG. 18

SEQUENCE DETECTOR

DOMESTIC PRIORITY

This application is a divisional application of U.S. patent application Ser. No. 15/251,673 filed on Aug. 30, 2016, now issued as U.S. Pat. No. 9,942,005, the disclosure of which is incorporated by reference herein in its entirety.

BACKGROUND

The present invention generally relates to sequence detectors. More specifically, the invention relates to a high-speed, low-power, low-complexity sequence detector with reduced latency for high speed applications.

SUMMARY

In one aspect, a sequence detector for detecting symbol values corresponding to a sequence of input samples received from a channel is provided. The sequence detector comprises: a branch metric unit configured to calculate branch metrics for respective possible transitions between states of a trellis; a path metric unit configured to accumulate branch metrics provided by the branch metric unit in order to establish path metrics; a survivor memory unit configured to select a survivor path based on the path metrics provided by the path metric unit and configured to output a survivor sequence of said detected symbols corresponding to the survivor path. The sequence detector is configured such that the synchronization length is different than the survivor path memory length.

According to a further aspect, a transmission system is provided. The transmission system comprises a transmitter providing a symbol sequence to a channel. The channel output is provided to a receiver comprising a detecting/decoding unit with at least one sequence detector/decoder. The sequence detector comprises a branch metric unit, a path metric unit and a survivor memory unit. The sequence detector comprises a synchronization length different than the survivor path memory length, wherein the transmitter is configured to provide modulated transmission symbols.

According to yet a further aspect, a method for transmitting data in a transmission system comprising a transmitter and a receiver including a decoder unit with at least one sequence detector is provided. The sequence detector comprises a branch metric unit, a path metric unit and a survivor memory unit, wherein the synchronization length of the sequence detector is chosen different than the survivor path memory length.

BRIEF DESCRIPTION OF THE SEVERAL VIEWS OF THE DRAWINGS

In the following embodiments of the invention are explained in greater detail, by way of example only, making reference to the drawings in which:

FIG. 17 illustrates a performance comparison table for choosing $h_1$=0.6; and

FIG. 18 illustrates a performance comparison table for choosing $h_1$=1.

DETAILED DESCRIPTION

Figure 1:
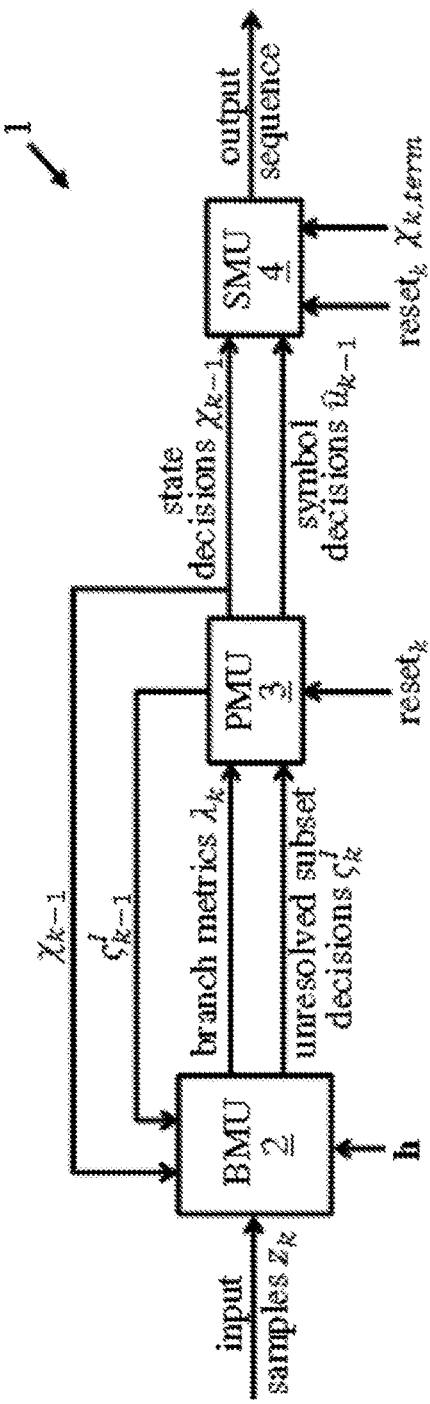
FIG. 1 shows an example schematic block diagram of a sequence detector.

The present invention may also include the following example features:

According to an example embodiment, the sequence detector is a sliding block Viterbi decoder. Using a sliding block Viterbi decoder, the speed of the sequence detector can be significantly increased.

According to an example embodiment, the sequence detector is a reduced-state sequence detector implementing a reduced-state subset trellis obtained by partitioning the constellation space. Using a reduced-state sequence detector mitigates the complexity problem of the MLSD attributable to the multi-level signal constellation and long channel dispersion by using set-partitioning principles and embedded per-survivor decision feedback with negligible performance degradation.

According to an example embodiment, the survivor memory unit is scaled according to the chosen survivor path memory length. Said scaling may be obtained by varying the number of stages for storing information regarding the survivor paths.

According to an example embodiment of the transmission system, the transmitter implements a 4-PAM or a 4-D 5-PAM modulation scheme. Using such modulation schemes decrease the symbol rate with respect to 2-PAM widely used in high speed transmissions, thereby reducing channel attenuation distortion and providing redundancy which can be used for coding and/or control signals.

According to an example embodiment of the transmission system, the modulation scheme is a TCM scheme. TCM uses signal-constellation expansion in conjunction with set partitioning to perform modulation and coding jointly, thereby achieving coding gains for improved system robustness.

According to an example embodiment of the transmission system, the transmitter implements a concatenated coding scheme using a first code and a second code. Thereby, the robustness of the transmission is significantly increased.

According to an example embodiment, the transmission system comprises a RS encoder which is coupled with a TCM encoder such that the RS encoder provides RS-coded symbols to the TCM encoder. Using RS coding as an error correction coding paired with TCM improves the system robustness. The latency saved by using different values of the synchronization length and the survivor path memory length can be used for said error correction coding in order to improve the error-rate performance.

According to an example embodiment of the transmission system, the decoding unit comprises multiple sequence detectors working in parallel. Thereby, the speed of the transmission system is significantly increased.

According to an example embodiment of the transmission system, the number of sequence detectors working in parallel is adapted according to the value of the synchronization length. In other words, the detection unit is scaled based on the chosen value of the synchronization length and the survivor path memory length.

According to example embodiments of the data transmission method, the transmitter provides modulated symbols according to 4-PAM or 4-D 5-PAM modulation scheme. Using such modulation schemes decrease the symbol rate with respect to 2-PAM widely used in high speed transmissions, thereby reducing channel attenuation distortion and providing redundancy which can be used for coding and/or control signals.

According to example embodiments of the data transmission method, the transmitter provides a TCM scheme. TCM uses signal-constellation expansion in conjunction with set partitioning to perform modulation and coding jointly, thereby achieving coding gains for improved system robustness.

According to example embodiments of the data transmission method, the transmitter provides a concatenated coding scheme using a first code and a second code. Thereby, the robustness of the transmission is significantly increased.

According to example embodiments of the data transmission method, the transmitter includes a RS encoder and a TCM encoder, wherein the TCM encoder receives RS-coded symbols. Using RS coding as an error correction coding paired with TCM improves the system robustness. The latency saved by using different values of the synchronization length and the survivor path memory length can be used for said error correction coding in order to improve the error-rate performance.

According to example embodiments of the data transmission method, the receiver comprises multiple sequence detectors and decoding of the received symbols is performed by parallelized decoding operation of said multiple sequence detectors. Thereby, the speed of the transmission system is significantly increased.

According to example embodiments of the data transmission method, the number of sequence detectors working in parallel varies according to the value of the synchronization length and the survivor path memory length. Thereby, the latency of the sequence detectors can be reduced by appropriately choosing the number of sequence detectors working in parallel.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the present document, terms detector unit and decoder unit, respectively, detector/decoder and detecting/decoding are used synonymously. Thus, terms detector unit, detector and detecting may be replaced by the duality detector unit/decoder unit, detector/decoder and detecting/decoding.

FIG. 1 indicates an exemplary basic structure of a sequence detector 1 embodying the invention. The sequence detector 1 comprises a branch metric unit (BMU) 2, a path metric unit (PMU) 3, and a survivor memory unit (SMU) 4. The units 2, 3, 4 of detector 1 comprise a series of pipeline stages. In particular, the BMU 2 comprises an initial set of pipeline stages, and the PMU 3 comprises a subsequent set of pipeline stages, where each set may in general comprise one or more stages. The BMU 2 receives a sequence of input samples obtained from an intersymbol interference (ISI) channel. The channel may be a transmission channel within a transmission system or a storage channel, i.e. the output of a storage device, e.g. the output of a tape. The input samples are obtained in known manner by sampling the channel output corresponding to a symbol sequence provided to the input to the ISI channel. The input sample sequence is input, sample by sample, to the BMU. When all input samples corresponding to the symbol sequence to be detected have been processed by the detector, the SMU 4 outputs a sequence of symbols with symbol values that have been detected as the most probable values corresponding to the input symbol sequence.

Figure 2:
FIG. 2 illustrates data transmitted via a channel comprising a plurality of termination blocks.

According to embodiments, the sequence of input samples received by detector 1 corresponds to a "termination block" as defined by the IEEE P802.3bj standard. This standard defines a termination block as a block of symbols which starts with, and is followed by, a known "termination symbol" as depicted schematically in FIG. 2. The standard specifies transmitting termination symbols that enable simplified detector architectures because the termination symbol is known to the receiver. As described further below, a plurality of sequence detectors may operate in parallel to process successive termination blocks in the input stream. However, each sequence detector 1 operates to detect the symbol values corresponding to the sequence of samples for a given termination block.

An ISI channel has a discrete-time impulse response with $v+1$ channel coefficients where $v>0$. In particular, the channel is modelled by its discrete-time impulse-response sequence $h=(h_0, h_1, \ldots, h_v)$ where $v$ is the number of interfering channel coefficients (channel memory). For a symbol $u_k$ input to the channel at time k, the corresponding channel output $y_k$ can be expressed as $y_k = \sum_{i=0}^{v} h_i u_{k-i}$ and is thus a function of $u_k$ and the v previous symbols $u_{k-1}$ to $u_{k-v}$. This output is corrupted by additive white Gaussian noise (AWGN) $w_k$, whereby the resulting input sample at sequence detector 1 is given by $z_k = y_k + w_k$.

The BMU 2 receives each input sample $z_k$ and also receives the channel coefficient vector $h=(h_0, h_1, \ldots, h_v)$ described above. For each input sample $z_k$, the BMU 2 calculates branch metrics $\lambda_k$ for respective possible transitions between states of a trellis. In particular, the coefficient vector h is used to produce hypothesized input values in a hypothesized value generator (HVG) of the BMU. The BMU 2 compares each input sample $z_k$ with the hypothesized input values and, using the outcomes of such comparisons, calculates the branch metrics (denoted by $\lambda_k$ in FIG. 1) and—in case of a reduced-state sequence detector (RSSD)—unresolved subset decisions (denoted by $\zeta_k^I$ in FIG. 1) associated with these. The branch metrics are used in PMU 3 to make decisions (state decisions $\chi_{k-1}$ in FIG. 1) on states in respective survivor paths through the trellis. These survivor paths represent possible symbol sequences corresponding to the input samples processed thus far. The state decisions $\chi_{k-1}$ and corresponding branch metrics $\lambda_k$ are used to update path metrics for these survivor paths. The PMU 3 makes tentative symbol decisions ($\hat{u}_{k-1}$ in FIG. 1) corresponding to the states for each survivor path. The state decisions $\chi_{k-1}$ and tentative symbol decisions $\hat{u}_{k-1}$ are supplied to the SMU 4 which stores the symbol decisions for the survivor paths. The survivor paths are thus updated in each time step. At the end of the input sequence, a reset/end of termination block signal "reset$_k$" is transmitted by a synchronizer to the PMU 3 to reset the path metrics at the end of the termination block. This reset signal is also supplied to the SMU 4 which selects, based on the known state $\chi_{k,term}$ corresponding to the termination symbol, the survivor sequence from the survivor paths, and outputs the symbol sequence thus detected.

Note that, as indicated in FIG. 1, the state decisions $\chi_{k-1}$ (and resolved subset decisions $\zeta_{k-1}^r$) are fed back by the PMU 3 to the BMU 2. The BMU 2 calculates the branch metrics in the initial set of pipeline stages, and the PMU makes state decisions, and calculates the path metrics, in a subsequent set of pipeline stages. Thus, while the BMU calculates branch metrics for a given input sample, the PMU makes state decisions for a previous input sample. In the embodiments detailed below, the PMU makes state decisions, and calculates the path metrics, in the next pipeline stage after the BMU. Hence, the branch metrics $\lambda_k$ for a given input sample $z_k$ are generated in the BMU in the same time step k as that in which the PMU makes state decisions $\chi_{k-1}$ for the preceding sample $z_{k-1}$.

Figure 3:
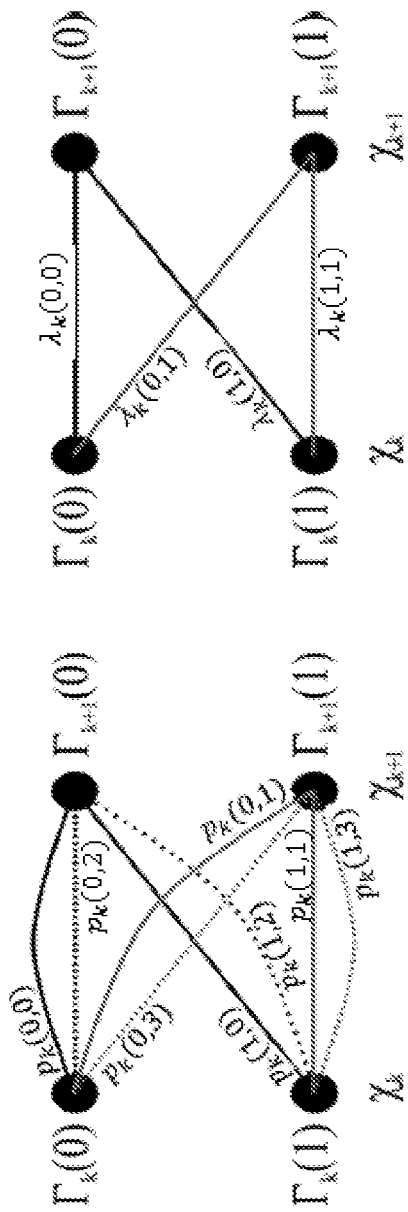
FIG. 3 shows trellis diagrams for a reduced state trellis indicating both unresolved parallel and resolved transitions.

According to example embodiments of sequence detector 1, the detector is a RSSD whereby the BMU 2 is adapted to calculate the branch metrics $\lambda_k$ for transitions between states (referred to below as "substates") of a reduced-state trellis. The reduced-state trellis is constructed via mapping by set partitioning. The reduced-state subset trellis for this embodiment is shown in FIG. 3 for both unresolved parallel transitions (left) and resolved transitions (right). The symbols $u_k$ transmitted over the channel in this embodiment are 4-PAM symbols selected from a signal constellation $\mathbb{A} = \{-3, -1, +1, +3\}$ in accordance with the IEEE P802.3bj standard. These symbols are allocated to subsets $\zeta \in \{\{-3, +1\}, \{-1, +3\}\}$. The reduced-state trellis has two substates $\chi = 0$ and $\chi = 1$. The subset to which the symbol $u_k$ belongs determines the substate $\chi_{k+1}$ at time k+1 according to: $\chi_{k+1} = 0$ if $u_k \in \{-3, +1\}$ and $\chi_{k+1} = 1$ if $u_k \in \{-1, +3\}$. At any time k there are two survivor paths, one ending in substate $\chi_k = 0$ and the other ending in substate $\chi_k = 1$, with path metrics $\Gamma_k(0)$ and $\Gamma_k(1)$, respectively. The branch metrics $p_k(\chi_k, u_k^i)$ corresponding to respective parallel transitions from substate $\chi_k$ when $u_k$ is transmitted (where $u_k^i$ is the index of $u_k$ in $\mathbb{A}$, $i \in \mathbb{Z}$ and $0 \leq i \leq 3$) are indicated in the left-hand diagram of FIG. 3. The branch metrics $\lambda_k(\chi_k, \chi_{k+1})$ corresponding to the resolved transitions of the reduced-state trellis are shown in the right-hand diagram of FIG. 3.

Figure 4:
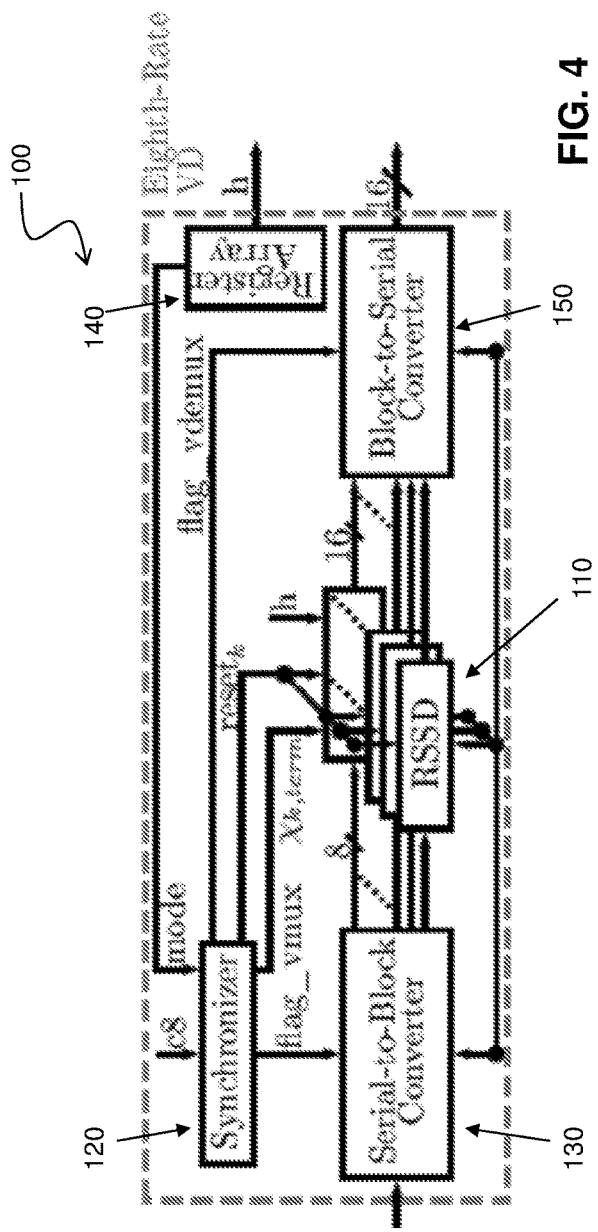
FIG. 4 schematically illustrates a block diagram of a decoding unit comprising multiple sequence detectors processing the incoming data in parallel.

FIG. 4 shows an example implementation of a decoding unit 100 comprising multiple sequence detectors. In the present embodiment, RSSDs 110 are used. However, according to other embodiments, also full-state sequence detectors can be used. Similarly, also only a single sequence detector can be included in the detection unit 100, for example, if the target data rate can be achieved.

In the present embodiment, the decoding unit 100 implements an eighth-rate Viterbi decoder. It is worth mentioning, that also other implementations are possible, i.e. lower rate Viterbi decoders or higher rate Viterbi decoders. The eighth-rate Viterbi decoder comprises eight or more RSSDs 110, or in general sequence detectors, a synchronizer 120, a serial-to-block converter 130, a register array 140 and a block-to-serial converter 150. The synchronizer 120 may be a state machine which organizes the data flow within the decoding unit 100. It may receive a clock signal (c8) as an input and additionally a termination substate $\chi_{k-l,term}$ and may output it 1 clock periods later to the RSSDs 110. Furthermore, the synchronizer 120 receives "mode" information. Said mode information includes information regarding the synchronization length for initialization (e.g. $\alpha \in \{0, 8, 16, 24\}$) and the number of needed RSSDs 110 operating in parallel. The synchronizer 120 is coupled with the serial-to-block converter 130 which receives a "flag_vmux" signal from said synchronizer 120. Said "flag_vmux" signal is a control signal for controlling the data flow within the serial-to-block converter 130.

The serial-to-block converter 130 is adapted to provide blocks of input signals to the RSSD 110 in order to enable parallel operation of the RSSDs 110. The serial-to-block converter 130 may comprise an embedded register array and may be adapted to distribute blocks of the channel output signals (sampled signals) to the RSSDs 110. In the present embodiment, in each clock period, the serial-to-block converter 130 receives eight input samples but outputs only one of them to an RSSD 110.

The outputs of the RSSDs 110 are coupled with the block-to-serial converter 150. The block-to-serial converter 150 may be a multiplexer which reorganizes the termination blocks such that they are output serially. For controlling the data flow within the block-to-serial converter 150, said block-to-serial converter 150 receives a control signal "flag_vdemux" from the synchronizer 120. The register array 140 may store the "mode" signal and may be coupled with the synchronizer 120 in order to provide the "mode" signal to the synchronizer 120. In addition, the register array 140 may store the discrete-time channel impulse response h of the ISI transmission channel.

In the following, the system model of the sequence detector and the impact of the synchronization length $\alpha$ and the survivor path memory length $\beta$ are explained in closer detail. Let a modulation symbol $u_k$ at time k be drawn from an M-PAM signal constellation $\mathbb{A}$ containing M≥2 equidistant symbols centered on the origin; i.e., $\mathbb{A} = (d_0/2)\{-M+1, -M+3, \ldots, M-1\}$ where $d_0$ is the minimum distance between symbols. A sequence of independent modulation symbols $u_k$ is transmitted over a dispersive channel with the discrete-time impulse-response sequence $h = (h_0; h_1; \ldots; h_v)$. The channel time-dispersion length v indicates the number of symbols that the ISI spans; i.e., there are v neighboring symbols interfering with the transmission of a symbol over the channel. The channel output $y_k = \Sigma_{i=0}^{v} h_i \cdot u_{k-i}$ is corrupted by additive white Gaussian noise (AWGN): $z_k = y_k + w_k$, where $z_k$ is the detector input, and $w_k$ is AWGN with zero mean and variance $\sigma_w^2$. The signal-to-noise ratio (SNR) of the channel equals $(E_s E_h)/\sigma_w^2$, where $E_s = E\{u_k^2\}$ is the average input-symbol energy, and $E_h = \Sigma_{i=0}^{v} h_i^2$ is the channel-response energy. The channel state is defined as an M-ary v-tuple: $x_k = (u_{k-1}, \ldots, u_{k-v})$.

The basic idea of the sequence detector, specifically a sliding block Viterbi decoder is from the fact that the survivor paths from all starting states merge with high probability $\alpha$ iterations back into the trellis. In other words, the competing survivor paths originating from any possible initial state in the trellis representing the state transitions merge with high probability after a number of iterations α. The parameter α is known as synchronization length. Similarly, starting from any terminal state, these survivor paths, with high probability, will merge with the true survivor sequence a number of iterations β back in the trellis. The parameter β is known as the survivor path memory length.

For high-speed implementations of the Viterbi algorithm, parallel processing of blocks of signal samples $z_k$ is necessary in practice, which leads to a sliding-block approach. The sliding block Viterbi decoder breaks the recursive nature of the Viterbi decoder allowing to independently decode blocks of the input stream. This approach requires achieving block independence by accounting for the synchronization length and survivor path memory length β in the design so that the competing survivor paths merge after the initialization and before the termination of the block of signal samples $z_k$.

To achieve a good performance-versus-complexity tradeoff in the presence of ISI and noise, an RSSD as described before is a viable solution for an implementable detector. In the uncoded 4-PAM transmission scheme, the channel state is represented by a state $\chi_k$ in a reduced-state subset trellis constructed by set partitioning principles, referred to as a substate. The branch metrics $\lambda_k(\chi_k; \chi_{k+1})$ associated with the reduced-state trellis equal $(z_k - \Sigma_{i=0}^{v} h_i \cdot u_{k-i} \Sigma_{i=1}^{l'} h_i \cdot \hat{u}_{k-i})^2$, where $l \in \{1, 2, \ldots, v\}$ and $\ddot{u}_k$ denotes a tentative symbol decision. The third term represents per-survivor decision feedback. As the branch metric, the SED can be replaced with the ED to reduce implementation complexity, provided that the resulting performance degradation is negligible.

In the following, the impact of the synchronization length α and survivor path memory length β on the receiver latency is evaluated. The latency L of a ($\lfloor \log_2 M \rfloor \cdot r$)–Gb/s full-rate sliding-block receiver implementing the Viterbi algorithm equals $(\alpha+\rho+\beta)/r$, where r is the modulation rate in GBaud, and ρ is the block length. A bit rate of ($\lfloor \log_2 M \rfloor \cdot r$) Gb/s is achieved with B=$(\alpha+\rho+\beta)/\rho$ sliding-block detectors, which operate in parallel at the modulation rate r. Should the modulation rate r be too high for a full-rate implementation, then an $R^{th}$-rate receiver at a reduced-rate clock of r/R can be implemented. In that case, the latency L becomes $(\alpha+\rho+\beta)R/r$, and the bit rate ($\lfloor \log_2 M \rfloor \cdot r$)Gb/s is obtained with B·R sliding-block detectors. Thereby it is assumed that the cascade of the filtering elements before the detector implementing the Viterbi algorithm limits the ISI to one post-cursor interferer $h_1 \neq 0$. The discrete-time impulse response sequence of the channel before the detector is thus h=($h_0$; $h_1$).

As already mentioned before, the IEEE P802.3bj standard defines a termination block as a block of symbols which starts with and is followed by a symbol referred to as the termination symbol. The standard specifies transmitting termination symbols that enable simplified detector architectures because the termination symbol is known to the receiver. Having to account for the survivor path memory length β at the end of a termination block for termination-independent block detection is thus avoided, as the survivor paths merge without ambiguity to the termination symbol following a termination block. Transmitting termination symbols also simplifies achieving initialization-independent block detection when only the main-cursor $h_0$ and first post-cursor $h_1$ channel coefficients are nonzero. To detect the first information symbol of a termination block, it is therefore necessary to take into account only the interference introduced by the preceding symbol, namely the termination symbol. Consequently, in this case, the termination symbols transmitted in compliance with the IEEE P802.3bj standard avoid the overhead attributable to the synchronization length α and survivor path memory length β, thereby reducing latency. Another advantage offered by using termination symbols is that the length of an error event is confined to the length of a termination block.

Figure 5:
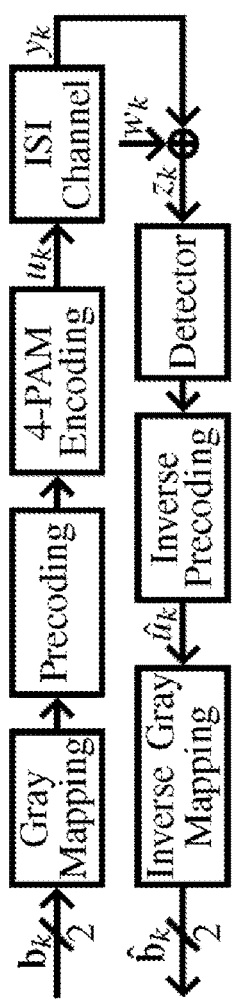
FIG. 5 illustrates a schematic block diagram of a transmission system implementing uncoded four-level pulse-amplitude-modulation (4-PAM) modulation scheme.

FIG. 5 illustrates an example block diagram of a transmission system implementing uncoded 4-PAM modulation scheme. A 2-bit input $b_k$ thereto is provided to a mapper providing Gray mapping. For example, the (1/(1+D) mod 4) precoding as specified in the IEEE P802.3bj standard is used so that the length of error events is reduced to two. The 4-PAM signal constellation with equiprobable symbols is chosen to be $\mathbb{A} = \{-3, -1, 1, 3\}$. The signal constellation $\mathbb{A}$ is partitioned into two subsets. So, the RSSD thus has two substates $\zeta_{k-1} \in \{\{-3, +1\}, \{-1, +3\}\}$.

Figure 6:
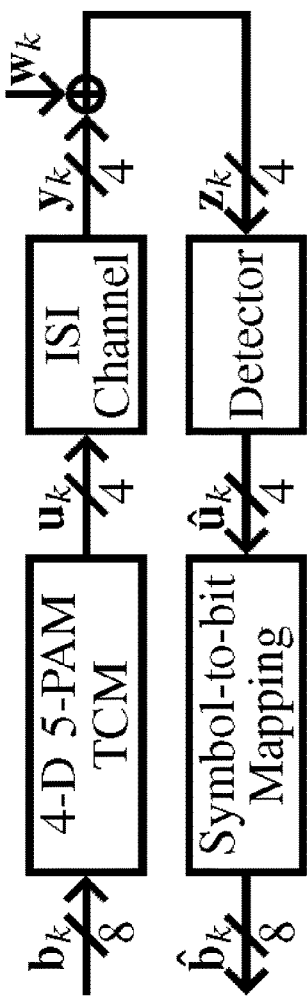
FIG. 6 illustrates a schematic block diagram of a transmission system implementing uncoded 4D 5-PAM trellis-coded-modulation (TCM) scheme.

FIG. 6 illustrates an example block diagram of a transmission system implementing a transmission scheme based on 4-D 5-PAM TCM. Said transmission scheme is adopted in IEEE P802.3ab standard. The 8-bit input $b_k$ thereto is transmitted over four channels. The ISI attributable to the first post-cursor channel coefficient $h_1$ is suppressed by per-survivor decision feedback to avoid expanding the number of detector states beyond eight. The signal constellation $\mathbb{A} = \{-2, -1, 0, 1, 2\}$ does not consist of equiprobable symbols, resulting in an average input-symbol energy $E_s$ of 1.8125 corresponding to a shaping gain of |10 log(1.8125/2)|≈0.4 dB. The signal constellation $\mathbb{A}$ is partitioned into two subsets: $\zeta_{k-1} \in \{\{-2, 0, 2\}, \{-1, 1\}\}$. This results in 16 different 4-D subsets, which are reduced to eight 4-D subsets by grouping two such subsets together. The subset partitioning is explained in detail in M. Hatamian et al., "Design considerations for gigabit Ethernet 1000Base-T twisted pair transceivers," in IEEE Custom Integrated Circuits Conf, 1998, pp. 335-342 and E. F. Haratsch and K. Azadet, "A 1-Gb/s joint equalizer and trellis decoder for 1000BASE-T gigabit ethernet," IEEE J. Solid-State Circuits, vol. 36, no. 3, pp. 374-384, March 2001 which are fully incorporated by reference.

Of the eight information bits $b_k$ incoming at each modulation interval, two are input to a 2/3-rate convolutional encoder. The three-bit output of the encoder is used to select one of the eight subsets, and the remaining 6-bit information is used to select a 4-D symbol in that subset. The bit-to-symbol mapping is performed via the tables given in *Physical Coding Sublayer, Physical Medium Attachment Sublayer and Baseband Medium, Type* 1000*BASE-T* IEEE Standard P802.3ab, 2012.

Figure 7:
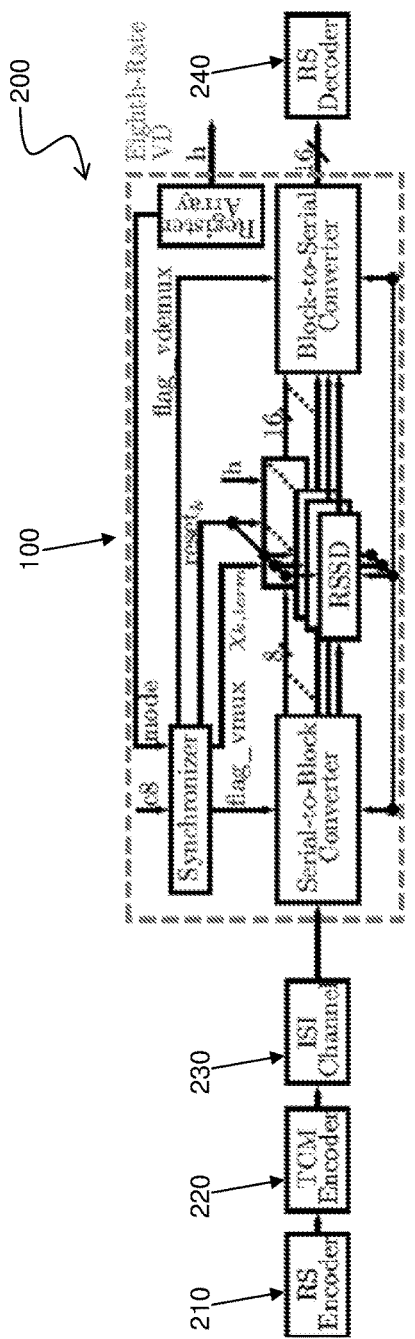
FIG. 7 shows a transmission system including a decoding unit according to FIG. 4 implementing an encoding scheme using Reed-Solomon (RS) encoding and TCM.

FIG. 7 illustrates a transmission system 200 including a decoding unit 100 according to FIG. 4 described above. The transmission system 200 implements a concatenated coding scheme using a first code and a second code. More in detail, the output of a RS encoder 210 is coupled with the input of a TCM encoder 220 and the TCM encoder 240 is coupled with the ISI channel 230. The TCM encoder 220 implements a trellis-coded modulation. So, the RS encoder 210 provides RS-coded symbols to the TCM encoder 220 in order to apply TCM modulation to the RS-coded symbols. In order to decode the RS-coded output of the decoding unit 100, a RS decoder 240 is provided. According to embodiments of the invention, the latency of the decoding unit 100 is reduced by choosing as small values for the synchronization length α and survivor path memory length β as possible, provided that the required error rate system performance is guaranteed. The saved latency is then invested in increasing the system robustness by providing an outer error correction coding (RS-coding), thereby improving the SER without violating latency constraints.

Figure 8:
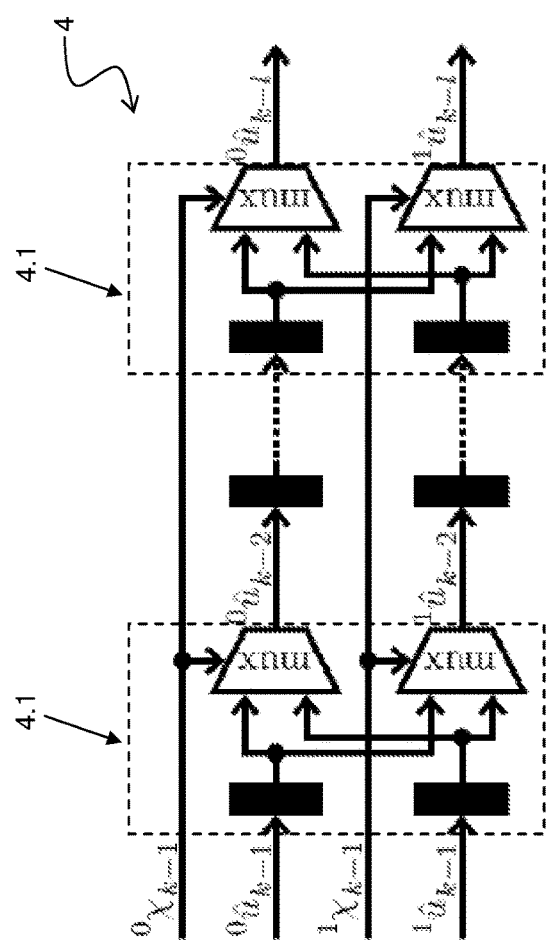
FIG. 8 illustrates an example embodiment of a survivor memory unit.

FIG. 8 illustrates an example embodiment of the Survivor Memory Unit (SMU) 4 shown in FIG. 1. The SMU 4 is in the following also referred to as Survivor Path Memory Unit. The SMU comprises multiple stages 4.1 for storing the survivor paths. The number of required stages 4.1 can be varied according to the selected survivor path memory length $\beta$. Specifically, if no termination-block-based transmission scheme is used, the SMU must have $\rho+\beta$ stages, wherein $\beta$ is the survivor path memory length and $\rho$ is the block length. By choosing different values of the synchronization length $\alpha$ and the survivor path memory length $\beta$, the latency caused by the SMU and therefore the latency of the decoder unit 100 can be significantly reduced.

In the following, simulation results illustrating examples of the embodiments of the invention are provided. In the simulations, ideal timing recovery is assumed. Without loss of generality, we normalize the main-cursor channel coefficient $h_0=1$. The discrete-time impulse-response sequence is then $h=(1; h_1)$. The performance degradation is considered as negligible when it is less than 0.15 dB at the target SER. When the synchronization length $\alpha$ and the survivor path memory length $\beta$ are considered for achieving block independence, a block length $\rho$ of 48 is assumed. The ED is adopted as the branch metric in the uncoded 4-PAM transmission scheme, as the resulting performance degradation is negligible. In the legends, ($h_1$, $\alpha$, $\beta$) specifies that the corresponding simulations were run with the synchronization length $\alpha$ and survivor path memory length $\beta$ over the channel with the discrete-time impulse-response sequence $h=(1; h_1)$. When $\alpha=\beta=1$, a known initial and terminal state were assumed.

First, simulation results referring to uncoded 4-PAM transmission system are provided.

Figure 9:
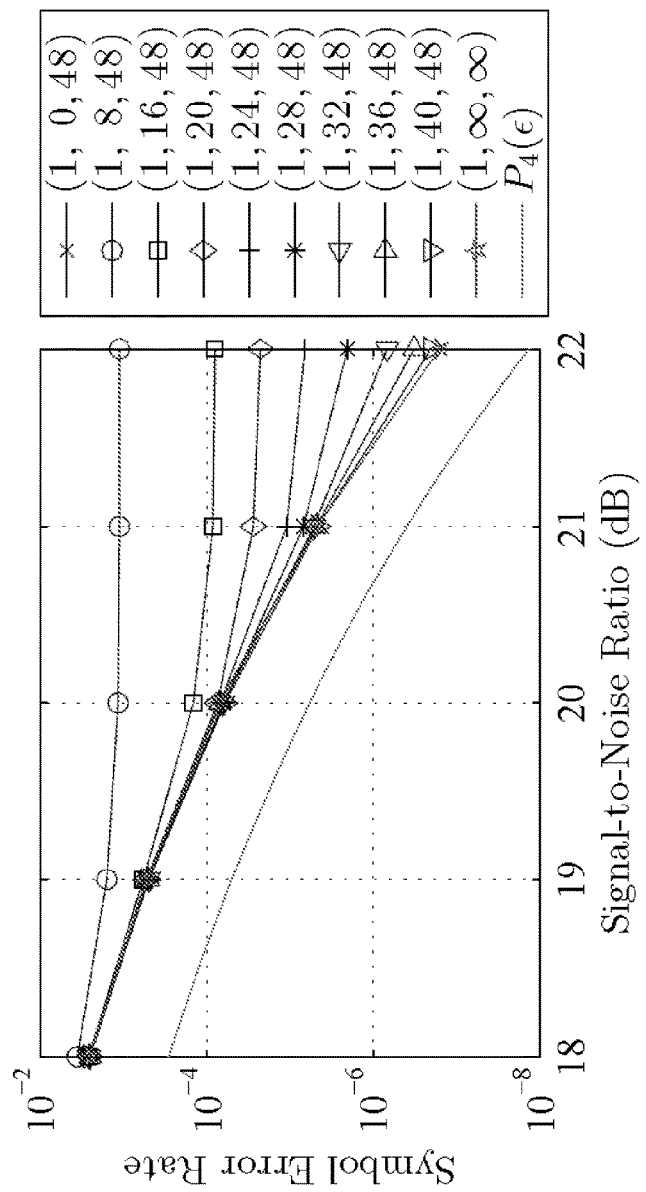
FIG. 9 illustrates symbol-error-rate (SER) performance of a two-substate reduced-state sequence detector (RSSD) for the channel with the discrete-time impulse-response sequence h=(1; 1) and various values of the synchronization length α.

The impact of the synchronization length $\alpha$ on the SER performance of a two sub state RSSD operating over the channel with the discrete-time impulse response sequence $h=(1; 1)$ is shown in FIG. 9. It can be seen in FIG. 9 that, for the survivor path memory length $\beta=48$, the synchronization length $\alpha$ must equal 28 or 40 for an SER of $10^{-5}$ or $10^{-7}$, respectively, with negligible performance degradation.

Figure 10:
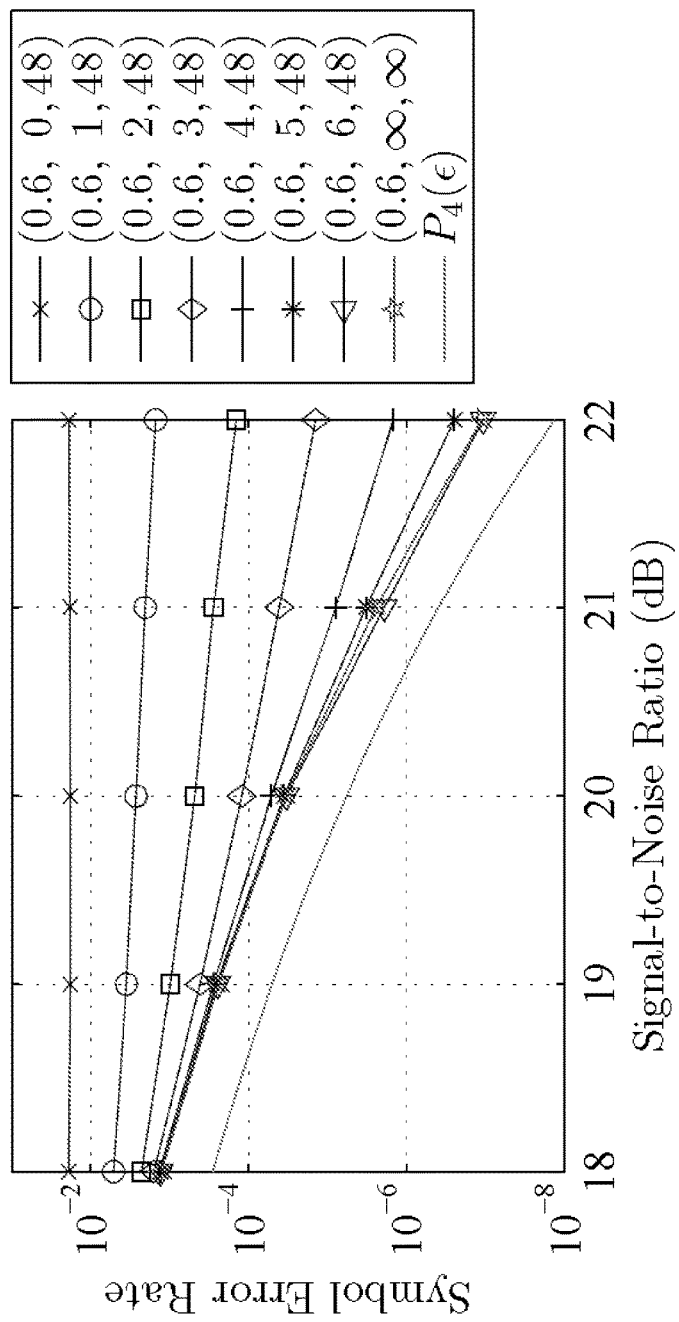
FIG. 10 illustrates SER performance of a two-substate RSSD for the channel with the discrete-time impulse-response sequence h=(1; 0.6) and various values of the synchronization length α.

FIG. 10 shows the SER performance for the channel with the discrete-time impulse-response sequence $h=(1; 0.6)$. In this case, for the survivor path memory length $\beta=48$, it is sufficient that the synchronization length $\alpha$ equals 5 or 6 for an SER of $10^{-5}$ or $10^{-7}$ respectively.

Figure 11:
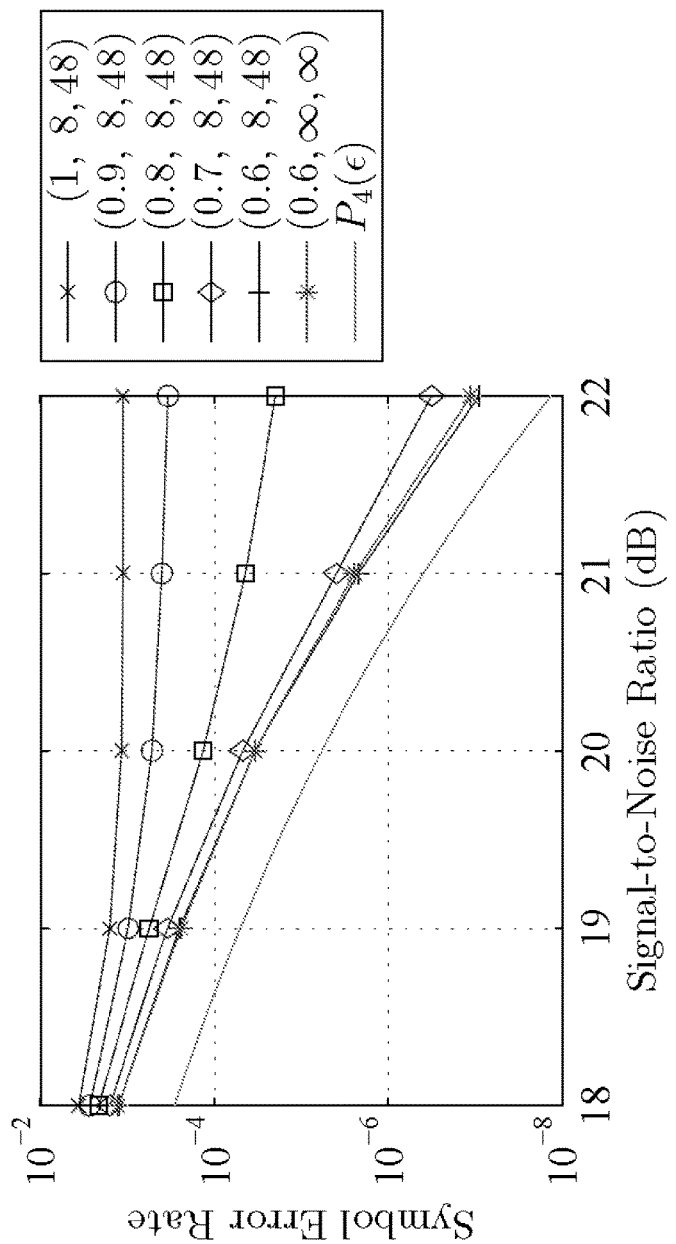
FIG. 11 illustrates SER performance of a two-substate RSSD for various values of the first post-cursor channel coefficient $h_1$.

The impact of the first post-cursor channel coefficient $h_1$ on the SER performance of the two-substate RSSD with the synchronization length $\alpha=8$ and the survivor path memory length $\beta=48$ is illustrated in FIG. 11. The SER performance of the RSSD is the same as that with independent blocks for the first post-cursor channel coefficient $|h_1|\leq0.6$.

Figure 12:
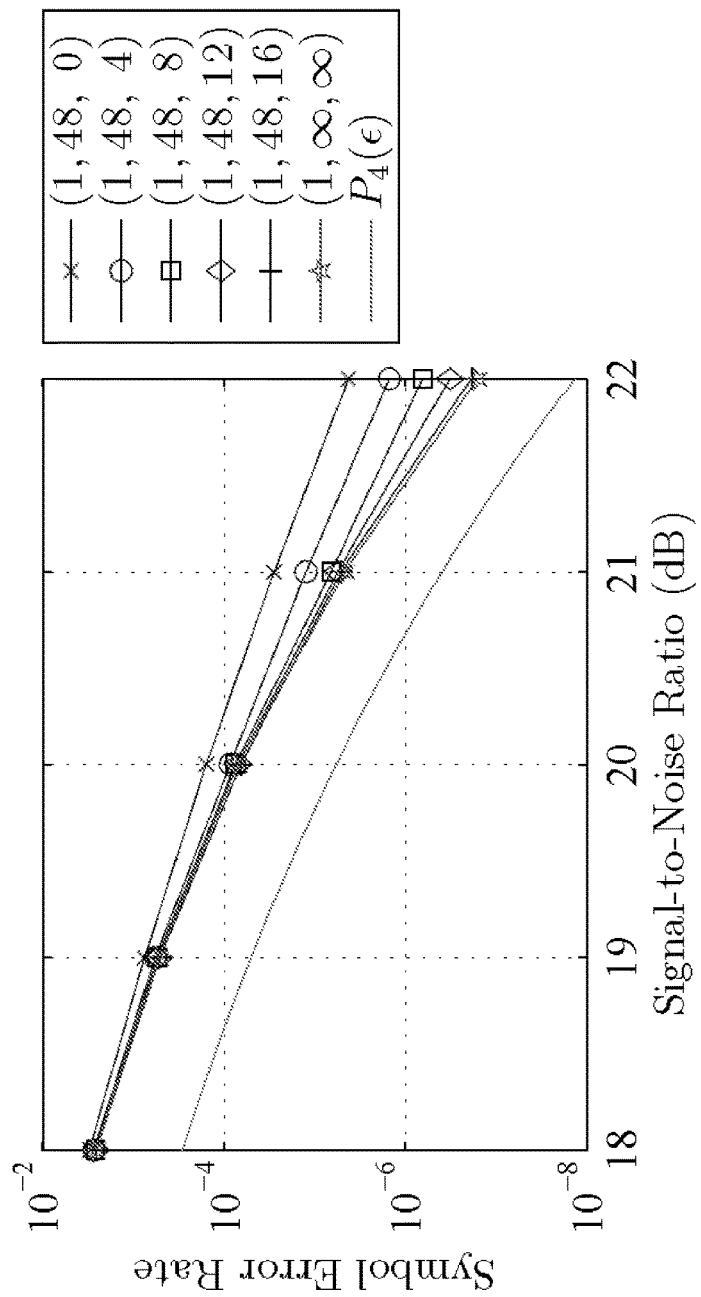
FIG. 12 illustrates SER performance of a two-substate RSSD for the channel with the discrete-time impulse-response sequence h=(1; 1) and various values of the survivor path memory length β.

The impact of the survivor path memory length $\beta$ on the SER performance of the two-substate RSSD operating over the channel with the discrete-time impulse-response sequence $h=(1; 1)$ is shown in FIG. 12. As opposed to the synchronization length $\alpha\in\{28, 48\}$, the survivor path memory length $\beta$ must only be 8 or 16 at an SER of $10^{-5}$ or $10^{-7}$, respectively, with negligible performance degradation. This is because no information is available about the initial substate, whereas the terminal path metrics determine the terminal substate from which to trace back through the trellis.

Figure 13:
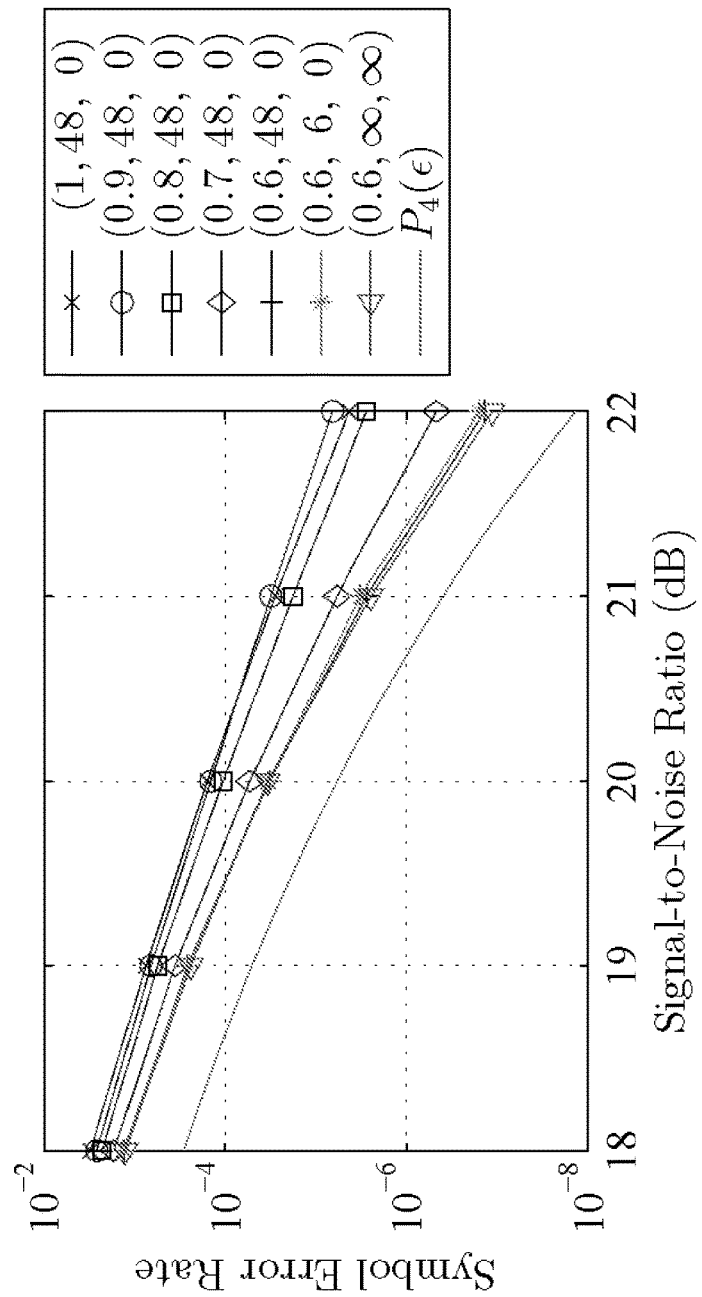
FIG. 13 illustrates SER performance of a two-substate RSSD for various values of the first post-cursor channel coefficient $h_1$.

The impact of the first post-cursor channel coefficient $h_1$ on the SER performance of the two substate RSSD is illustrated in FIG. 13. The overhead due to the survivor path memory length $\beta$ can be avoided for the first post-cursor channel coefficient $|h_1|\leq0.6$ because the performance degradation for the survivor path memory length $\beta=0$ is negligible, as shown for the case of the synchronization length $\alpha=6$ and the survivor path memory length $\beta=0$, which yields negligible performance degradation at an SER of $10^{-7}$.

At an SER of $10^{-5}$, the latency L of the two-substate RSSD achieving block independence equals 53R/r for the first post-cursor channel coefficient $h_1=0.6$ and 84R/r for the first post-cursor channel coefficient $h_1=1$, respectively. Obtaining a lower SER=$10^{-7}$, the latency L of the two-substate RSSD achieving block independence equals 54R/r for the first post-cursor channel coefficient $h_1=0.6$ and 104R/r for the first post-cursor channel coefficient $h_1=1$, respectively.

In the following, simulation results referring to a 4-D 5-PAM TCM transmission system are provided.

Figure 14:
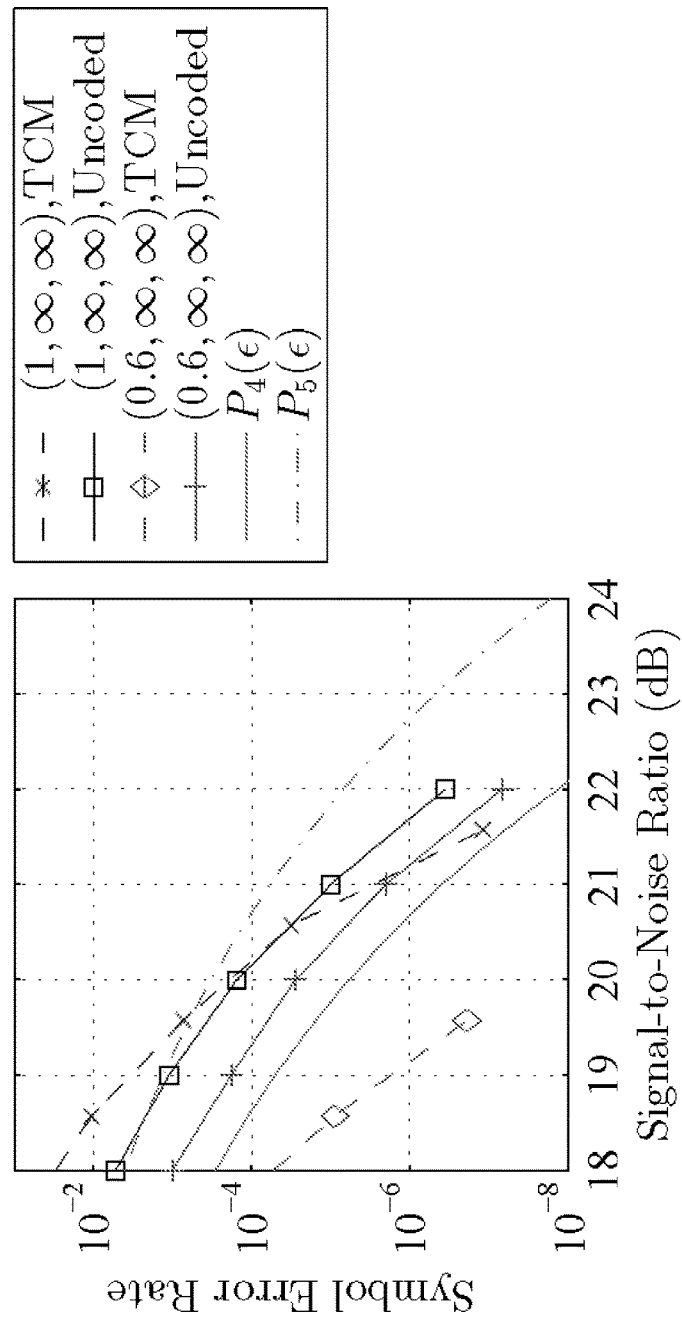
FIG. 14 illustrates SER performance comparison between a two-substate RSSD and an eight-state RSSD for the uncoded 4-PAM transmission scheme and 4-D 5-PAM TCM system with the squared Euclidean distance (SED) as the branch metric, respectively.

The 5-PAM SER performance of an eight-state RSSD is compared in FIG. 14 with that of the two-substate RSSD for uncoded 4-PAM, operating over a channel with the first post-cursor channel coefficient $h_1$ equal to 1 or 0.6. The SED is chosen as the branch metric because it is optimum or near optimum. When the first post-cursor channel coefficient $h_1=0.6$, the SNR gain of the 4-D 5-PAM TCM system over the uncoded 4-PAM transmission scheme is approximately 2 dB at an SER of $10^{-5}$ and 2.5 dB at an SER of $10^{-7}$. For the channel with the discrete-time impulse-response sequence $h=(1; 1)$, this gain is reduced to approximately 0.2 dB at an SER of $10^{-5}$ and 0.5 dB at an SER of $10^{-7}$.

Figure 15:
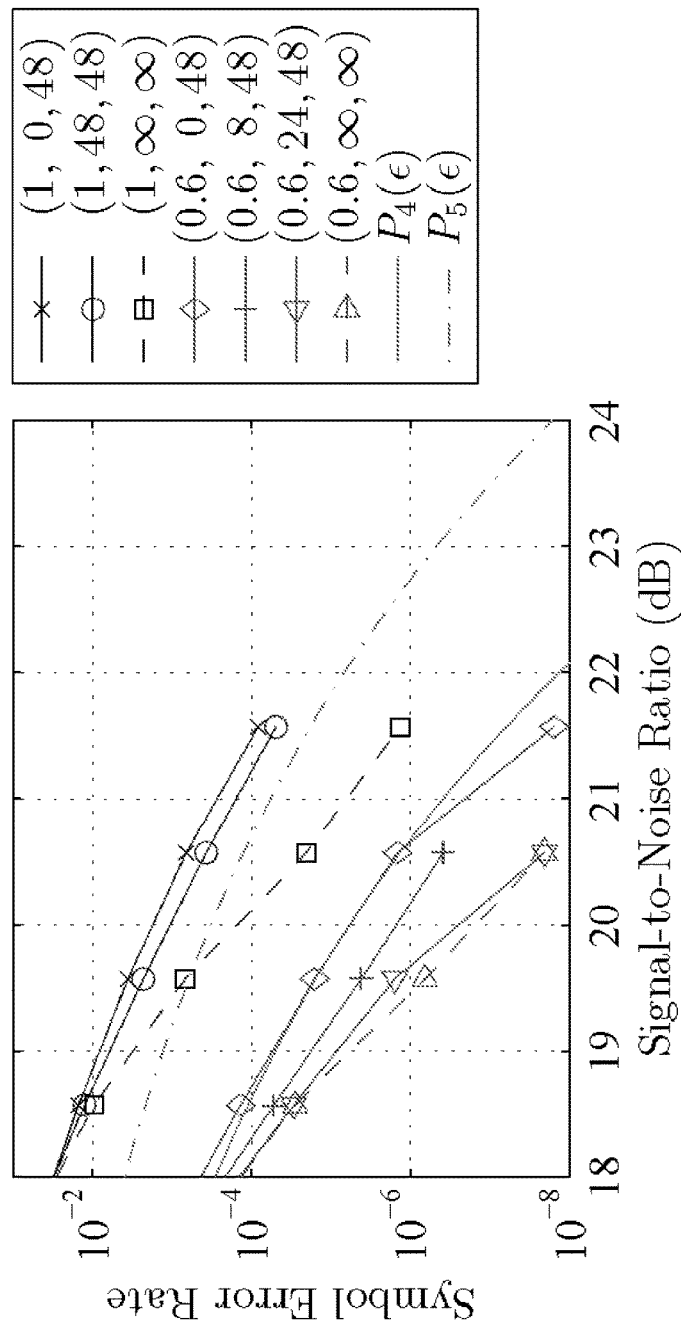
FIG. 15 illustrates SER performance of an eight-state RSSD with the Euclidian distance (ED) as the branch metric for various values of the synchronization length α and the first post-cursor channel coefficient $h_1$.

The impact of the synchronization length $\alpha$ on the SER performance of the eight-state RSSD operating over a channel with the first post-cursor channel coefficient $h_1$ equal to 1 or 0.6 is shown in FIG. 15. The ED is chosen as the branch metric in order to reduce implementation complexity. For the survivor path memory length $\beta=48$, the synchronization length $\alpha=8$ at an SER of $10^{-5}$ and the synchronization length $\alpha=24$ at an SER of $10^{-7}$ suffice to yield negligible performance degradation for the first post-cursor channel coefficient $h_1=0.6$. However, for the channel with the discrete-time impulse-response sequence $h=(1; 1)$, at an SER of approximately $10^{-5}$, an SNR penalty of 1.1 dB is incurred for the synchronization length $\alpha=48$. Compared with the uncoded 4-PAM transmission scheme, the increase in the synchronization length $\alpha$ is due to the decrease in the probability of initializing the state sequence from the correct state, as the number of detector states is increased from two to eight.

Figure 16:
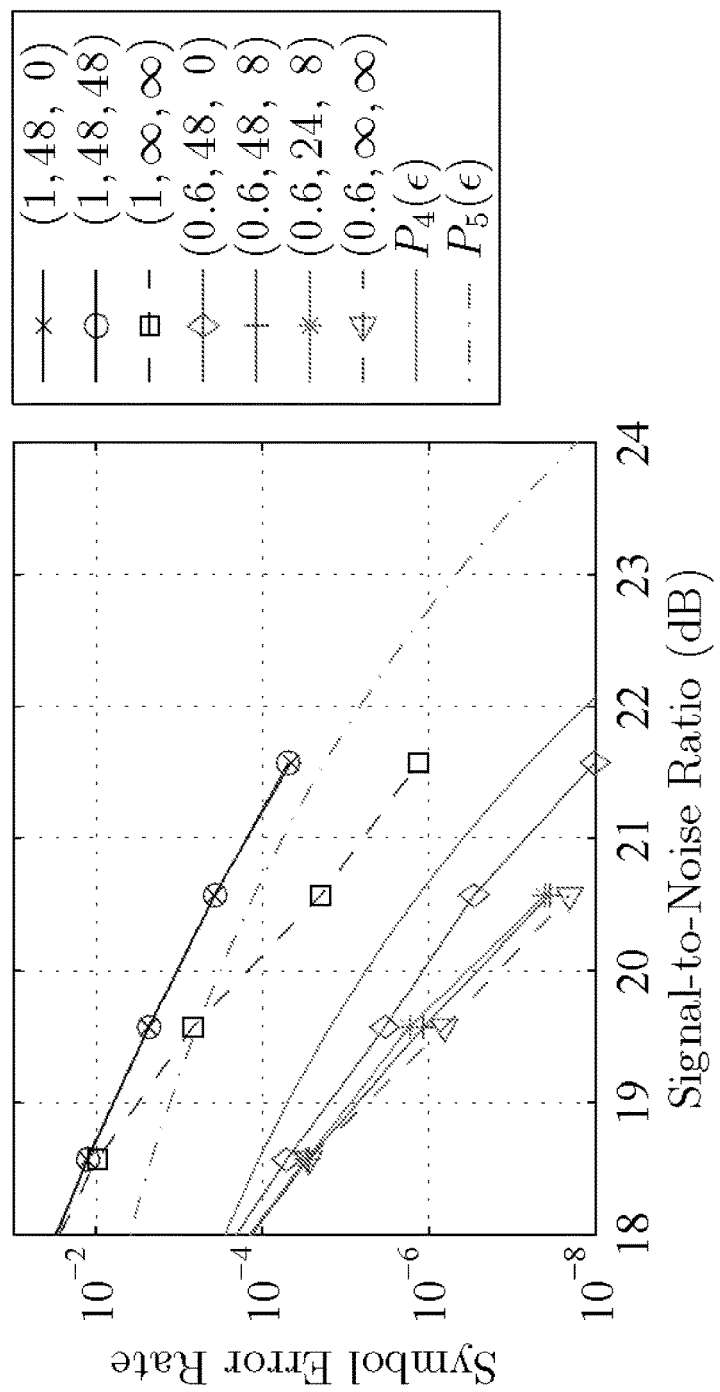
FIG. 16 illustrates SER performance of an eight-state RSSD with the ED as the branch metric for various values of the survivor path memory length β and the first post-cursor channel coefficient $h_1$.

The impact of the survivor path memory length $\beta$ on the SER performance of the eight-state RSSD operating over a channel with the first post-cursor channel coefficient $h_1$ equal to 1 or 0.6 is shown in FIG. 16. Again, the ED is chosen as the branch metric in order to reduce implementation complexity. For the synchronization length $\alpha=48$, the survivor path memory length $\beta=0$ at an SER of $10^{-5}$ and the survivor path memory length $\beta=8$ at an SER of $10^{-7}$ suffice to yield negligible performance degradation for the first post-cursor channel coefficient $h_1=0.6$. The fact that the number of detector states is increased from two to eight does not significantly increase the survivor path memory length $\beta$, as the terminal path metrics determine with high probability the correct terminal state from which to trace back through the trellis. The results shown in FIG. 16 indicate that the choice of the synchronization length $\alpha=24$ and the survivor path memory length $\beta=8$ yields negligible performance degradation at an SER of $10^{-7}$. Compared with the corresponding case in FIG. 14, an SNR loss of 0.5 dB is incurred at an SER of $10^{-7}$ because of simplifying the branch metric $\lambda_k$ from the SED to the ED.

Finally, the impact of employing termination symbols in the transmission system on the latency of the RSSD for a constant block length ρ=48 is evaluated. The benefit of using termination symbols in the uncoded 4-PAM transmission system depends on the channel considerably. From the table shown in FIG. 17, it can be deduced that the lack of termination symbols in the transmission system increases the latency L by 10.4% and 12.5% at an SER of $10^{-5}$ and $10^{-7}$, respectively, when the first post-cursor channel coefficient $h_1$ equals 0.6. When the first post-cursor channel coefficient $h_1$ equals 1, then the latency increase is 75% and 216.7%, as can be seen from the table shown in FIG. 18. As for the 4-D 5-PAM TCM system, it can be deduced from the table in FIG. 17 that the latency increases by 16.7% and 66.7% at an SER of $10^{-5}$ and $10^{-7}$, respectively, when the first post-cursor channel coefficient $h_1$ equals 0.6. When the first post-cursor channel coefficient $h_1$ equals 1, the increase in latency is so great that the advantage of using termination symbols becomes apparent.

Summing up, sequence decoders and transmission systems implementing a Viterbi algorithm comprising different values for the synchronization length α and the survivor path memory length β have been presented. In particular, with coded modulation schemes and/or ISI channels, both of these lengths differ significantly from each other in an optimized parallelized high-speed Viterbi detector design which minimizes latency and implementation complexity while achieving the error-rate performance of a Viterbi detector with very long synchronization and survivor path memory lengths. The implementation complexity and latency of the receiver can thus be reduced without degrading error rate performance, compared with a receiver that keeps the synchronization length equal to the survivor path memory length.

What is claimed:

1. A method for transmitting data from a transmitter to a receiver in a transmission system, the method comprising:
   receiving, at a decoder circuit of the receiver including at least one sequence detector, a sequence of input samples delivered over a channel from the transmitter, the at least one sequence detector configured to decode the sequence of input samples according to a configurable synchronization length;
   determining, via a branch metric circuit of the at least one sequence detector, branch metrics of respective transitions between states of a trellis based on the sequence of input samples;
   accumulating, via a path metric circuit of the at least one sequence detector, the branch metrics provided by the branch metric circuit so as to establish path metrics;
   selecting, via a survivor memory circuit of the at least one sequence detector, a survivor path having a survivor path memory length based on the path metrics provided by the path metric unit;
   outputting, via the survivor memory circuit, a survivor sequence of detected symbols corresponding to the survivor path; and
   configuring the at least one sequence detector such that the synchronization length of the at least one sequence detector is chosen different than the survivor path memory length.

2. The method of claim 1, wherein the transmitter provides modulated symbols according to a four-level pulse-amplitude-modulation (4-PAM) or a four-dimensional (4-D) five-level pulse-amplitude-modulation (5-PAM) modulation scheme to reduce attenuation distortion of the channel.

3. The method of claim 2, wherein the transmitter further provides a trellis-coded modulation scheme to reduce latency of the decoder circuit.

4. The method of claim 1, wherein the transmitter provides a concatenated coding scheme to improve robustness when transmitting data from the transmitter to the receiver.

5. The method of claim 1, wherein the transmitter includes a Reed-Solomon (RS)-encoder and a trellis-coded-modulation (TCM) encoder, wherein the TCM encoder receives RS-coded symbols and applies Trellis coding to said RS-coded symbols to improve symbol-error-rate (SER) of the decoder circuit.

6. The method of claim 1, wherein the detector circuit includes multiple sequence detectors connected in parallel and is configured to decode symbols received from the transmitter.

7. The method of claim 6, wherein a number of the multiple sequence detectors is connected in parallel and is varied according to the value of the synchronization length and the survivor path memory length.

* * * * *